United States Patent

[11] 4,174,422

Matthews, decreased et al.

[45] Nov. 13, 1979

[54] GROWING EPITAXIAL FILMS WHEN THE MISFIT BETWEEN FILM AND SUBSTRATE IS LARGE

[75] Inventors: John W. Matthews, decreased, late of Ossining, N.Y., by Valerie A. Matthews, executrix; William M. Stobbs, Cambridge, England

[73] Assignee: International Business Machines Corporation, Armonk, N.Y.

[21] Appl. No.: 866,088

[22] Filed: Dec. 30, 1977

[51] Int. Cl.$^2$ .................... B32B 15/04; H01L 21/205; H01L 21/84; H01L 29/26

[52] U.S. Cl. .................................. 428/621; 148/175; 156/610; 156/612; 156/613; 428/673; 428/680

[58] Field of Search ............... 156/612, 611, 613, 614, 156/610, DIG. 100, DIG. 101; 427/123, 124, 125; 148/175; 357/60; 428/209, 164, 910, 621, 673, 680; 136/89 R; 204/383, 385, 40

[56] References Cited

U.S. PATENT DOCUMENTS

| | | | |
|---|---|---|---|
| 3,661,676 | 5/1972 | Wong et al. | 156/612 |
| 3,788,890 | 1/1974 | Mader et al. | 156/601 |
| 3,935,040 | 1/1976 | Mason | 156/610 |
| 3,985,590 | 10/1976 | Mason | 156/612 |

FOREIGN PATENT DOCUMENTS 2438588  2/1975  Fed. Rep. of Germany ........... 156/612

*Primary Examiner*—Stanley S. Silverman
*Attorney, Agent, or Firm*—Graham S. Jones, II

[57] ABSTRACT

A method is described for reducing the defect density in a crystalline film grown on a substrate with which it has a substantial misfit. The principle of the method is to grow the film, not directly from the substrate, but from a layer of small islands previously deposited onto the substrate. The technique has been fully investigated for the growth of Ag (and then Au) films on NaCl, a substantial improvement in the quality of the overgrown film being obtained when an intermediate layer of Ni islands is deposited on the NaCl prior to the deposition of the Ag. It has been demonstrated that it is important for the intermediate islands to be (a) generally epitaxially aligned with the substrate, even if as a result of their misfit with the substrate, they are partially incoherent;

(b) weakly bonded to the substrate so that they can move on this substrate during the deposition of the upper layer upon them;

(c) approximately hemispherical and small so that elastic strains in the overgrown layer decay rapidly with distance from the island and so that the preferred adatom site density is large on the islands compared with the substrate despite a relatively low coverage of islands on the substrate of about 10%;

(d) be of intermediate misfit with the substrate compared with the crystal layer to be overgrown.

While these principles have been demonstrated for the NaCl/Ni island (Ag/Au) system, it is to be expected that the use of this "multiple aligned seed island" technique could be applied to a number of other systems, such as the growth of GaAs on Si or GaP on GaAs or Si on Al$_2$O$_3$, provided that the material and general specifications of the intermediate seed islands met those listed above.

10 Claims, 3 Drawing Figures

GROWING EPITAXIAL FILMS WHEN THE MISFIT BETWEEN FILM AND SUBSTRATE IS LARGE

BACKGROUND OF THE INVENTION

1. Field of the Invention

This invention relates to thin films and more particularly, it relates to epitaxial thin films.

2. Description of the Prior Art

Single crystals of many materials have been grown epitaxially upon a substrate composed of a single-crystal structure. However, the degree of perfection of the films obtained is generally low unless the degree of misfit between the stress-free lattice parameters for the film and the substrate is small. It is possible, for example, to grow perfect films of doped silicon on silicon (where the misfit can be as low as $10^{-5}$) but it is difficult to grow perfect films of GaP or GaAs (where the misfit is about $4 \times 10^{-2}$). When the misfit is small, thin films grown on a substrate will sometimes strain elastically to match the substrate. Examples quoted in "Coherent Interfaces and Misfit Dislocations," *Epitaxial Growth, Part B*, edited by J. W. Matthews, pp. 572-573, Academic Press, New York 1975, include nickel on copper.... gold on silver....palladium on gold....platinum on gold....cobalt on copper....α-iron on copper....α-iron on gold....germanium on gallium arsenide....lead sulfide on lead selenide....and garnet films on garnet substrates.

It is also well known that face centered cubic (f.c.c.) metals tend to form weak bonds with alkali halides and that in a number of cases epitaxially aligned but poor quality thin films can be grown on such substrates despite relatively large misfits (J. W. Matthews op. cit. p. 566). In these circumstances, the growth of the epitaxial film begins with the generation of isolated three-dimensional islands.

Many partial solutions to the problem of growing good quality epitaxial films on a substrate with which the overgrowth has a large misfit have been suggested. Abrahams et al, J. Material Science, Vol. 4, p. 223 (1969) have shown that the growth of a graded alloy layer between a substrate and the ultimate deposite desired can yield a deposit with a fairly low dislocation density. However, it should be emphasized that the resultant defect density in the final film is nowhere near the ideal. It is much higher than the density of defects in the substrate. Also, the method is impractical when the misfit is larger than a few percent because the lattice parameter gradient in the graded region must be small. Thus, when the misfit is large, the thickness of the graded region becomes prohibitively large.

U.S. Pat. No. 3,935,040 of Mason teaches depositing a layer of SiGe alloy epitaxially upon a pure Si single crystal substrate by gradually increasing the Ge concentration from 0% to 8% over a layer thickness of a few micro-meters using vapor phase deposition techniques. Then GaP is deposited upon the SiGe alloy. The lattice constant for Si is 5.42 and that GaP is 5.45, which relatively minimal (0.56%) mismatch is reduced by the above process. The result can again be unsatisfactory if the thickness or electrical properties of the intermediate layers are important.

U.S. Pat. No. 3,661,676 of Wong teaches using small single crystals of $Al_2O_3$ positioned and cemented on a polycrystaline aluminum substrate for forming a large single crystal of $Al_2O_3$ by catalytic oxidation of $AlCl_3$ in the presence of water vapor. This method differs from that described here in that the substrate is not a single crystal; the seed crystals are not microscopic, do not have spherical surfaces facing away from the substrare, and are not loosely bonded to the substrate to permit sliding across the substrate. The patent does not indicate the number of deflects in the single crystal produced. There is also no mismatch between the lattice constants of the layers.

U.S. Pat. No. 3,788,890 of Mader and Matthews, entitled "Method of Preparing Dislocation-Free Crystals" describes an epitaxial deposition techanique with no intermediate layer, by means such as vacuum deposition upon a suitable monocrystalline plane.

SUMMARY OF THE INVENTION

In accordance with this invention a thin film structure is composed of laminations of several materials including a substrate having a surface of a first single crystal material, an intermediate layer of a plurality of islands of an intermediate material deposited in epitaxial alignment on the surface of the first crystal material, and an epitaxially crystalline upper layer of a third material deposited in the form of a single crystal upon the surface, and the intermediate layer has a substantial lattice misfit between the third material and the first single crystal material. Further in accordance with the invention, an epitaxial film of a fourth material is deposited upon the upper layer in the form of a single crystal of the fourth material.

Still further in accordance with the invention, the substrate comprises monocrystalline NaCl, the intermediate layer comprises epitaxial Ni crystal islands, and the third material comprises monocrystalline epitaxial Ag crystals.

Further in accordance with the above, an epitaxial monocrystalline film of a fourth material comprising Au is deposited upon the upper layer in the form of a single crystal of Au.

In another aspect of this invention, is a method for producing a thin epitaxial monocrystalline film of a metal including vacuum depositing islands of an intermediate material upon a substrate having a deposition surface composed of a monocrystalline material, and vacuum depositing the epitaxial monocrystalline film of a metal upon the depositon surface covered with the islands of an intermedaite material. Further in accordance with the above method, a film of a fourth material is vacuum deposited epitaxially upon the epitaxial monocrystalline film. Still further in accordance with the above method, the deposition surface of the substrate comprises a monocrystalline NaCl structure; the islands comprise epitaxially monocrystalline Ni structures formed on the NaCl structure; and the metal comprises monocrystalline epitaxial Ag crystals. In another aspect in accordance with the above method, an epitaxial film of a fourth material comprising Au is vacuum deposited upon the epitaxial Ag crystals.

DETAILED DESCRIPTION OF THE PREFERRED EMBODIMENT

This invention provides a method and a product. The method produces the product by growing unusually perfect epitaxial layers on substrates where the misfit is large (of the order of 12% and more).

Figure 1:
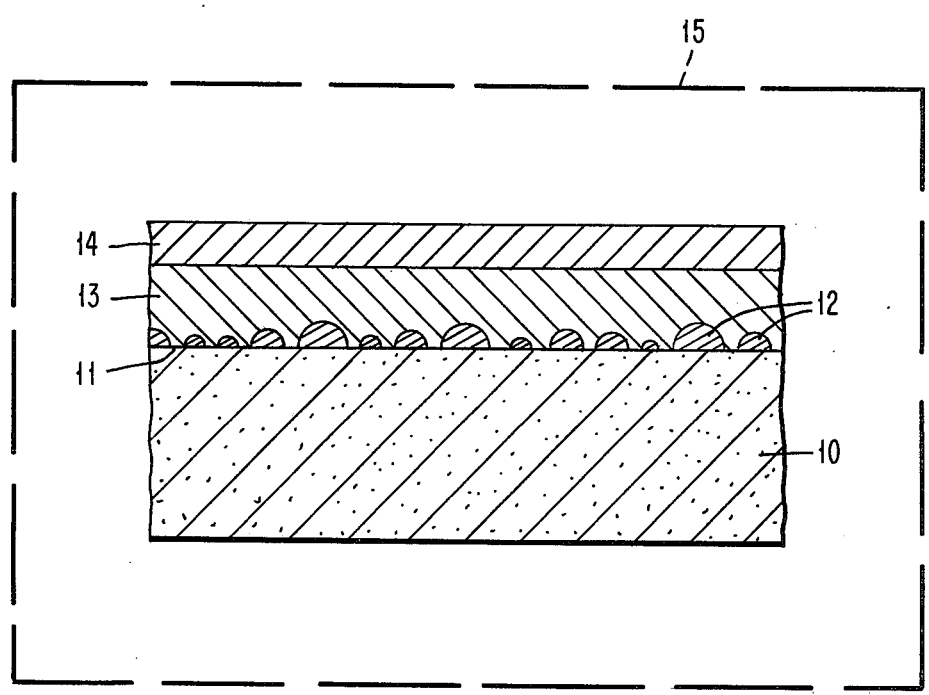
FIG. 1 shows a schematic sectional drawing of an epitaxial thin film structure embodying the instant invention.

FIG. 1 shows a schematic diagram of the cross-section of an epitaxial structure made using the technique described here. A substrate 10 of NaCl was cleaved in an ultra-high vacuum at a pressure of less than $10^{-9}$ Torr. A thin layer of nickel islands, 12, was then deposited on the clean surface 11 of substrate of <100> normal with the sodium chloride substrate 10 at a temperature of 250° C. The nickel was deposited for a time sufficient for the formation of about $10^{11}$ islands 12 per square centimeter of diameter about 10 nm (i.e., $10 \times 10^{-9}$ meters). The islands 12 tned to have a generally spherical surface falling upwardly as illustrated in the exaggerated schematic section (FIG. 1). The islands 12 are also aligned generally with the substrate (despite a large misfit) and are weakly bonded to it. For a general discussion of the vacuum deposition of thin films of nickel on hot cleaved NaCl see J. W. Matthews "Growth of Face-Centered-Cubic Metals in Sodium Chloride Substrates," Journal of Vacuum Science and Technology, Vol. 13, pages 133–145 (1966). A silver silm 13 was then deposited under a pressure of $\simeq 10^{-9}$ Torr and at 250° C. to form a continuous film 13 about 500 nm in thickness. This silver film 13 nucleates mainly on the nickel islands 12 rather than on the underlying NaCl surface 11. Deposition of a monocrystalline gold film 14 by a flash evaporation is described below. When silver is deposited upon vacuum cleaved NaCl, the resulting film is not only imperfect, it is often not even epitaxial (J. W. Matthews "The Role of Contaminants in the Epitaxial Growth of Gold on Sodium Chloride," Phil. Mag. 12, 1143–1154, 1965). In the situation when the silver is grown on the nickel islands, epitaxial growth occurs however with $001_{Ag}|001_{Ni}|001_{NaCl}$ (i.e., the layers have parallel crystal structures along those planes), though it should be noted that this is not the case for a continuous intermediate nickel film.

It will be noted that the relaxed misfit of Ag (with a=0.408 nm) on Ni (with a=0.352 nm) is large: about −16%. In the constrained situation, the misfit will still be about two-thirds of this value, and it will then be clear that a fully coherent interface between the Ag and Ni is extremely unlikely even for very small islands. Under normal overgrowth conditions with the deposition of a continuous film on another crystalline material with such a large misfit, the overgrowth will tend to be completely incoherent (this is, indeed, the case for the deposition of Ag upon a continuous crystalline Ni film). When, however, the overgrowth is onto small aligned, crystalline islands tending to be hemispherical in shape, the elastic strain field in the overgrowth (associated with the attempt of the overgrowth to grow epitaxially and coherently) fals off with distance r from the islands as $1/r^3$. To illustrate the effect of this difference in the form of the retained strain fields for the two different modes of growth: if we suppose that there is an elastic strain of 2% at the interface between the nickel and the silver for islands of 10 nm radius, the strain would fal to $2 \times 10^{-6}$% at the top of a 1 μdeposit of Ag on the islands. The elastic strain for a similar depth of Ag deposit on a continuous nickel deposit would be $10^6$ times larger or, to put it another way, one would need a 1 cm thickness of Ag to reduce the elastic strain to the same degree.

This tendency of there being a higher elastic strain gradient around the islands in the Ag overgrowth has two important effects. Firstly and most directly, a higher constrained misfit can be tolerated than at a flat interface, the strain energy in the overgrowth being lower. Secondly, any defects produced during the deposition of the overgrowth will have a strong tendency to be attracted to the island overgrowth interface. We have demonstrated the importance of the misfitting interface by showing that the defect density of a nickel film growth on nickel islands is higher than of a silver film grown on nickel islands.

We examined the quality of silver films grown on a range of nickel island coverage densities and island sites and shapes. All these thin film examinations were completed using transmission electron microscopy. The Ag film together with the nickel islands upon which it grew was separated from the NaCl by dissolving the latter in water in the normal manner. For zero island density, the principal defects in the Ag are stacking faults, and for a continuous nickel film, the silver is polycrystalline but for islands of about 10 nm in diameter and coverage anything between about 5% and 30%, there is a marked improvement in the defect density in the Ag overgrowth relative to growth without the intermediate island layer by a factor of up to 100. During this investigation we noted that for a given coverage the silver had a higher defect densityin regions where the islands were larger and had tended to lose their hemispherical shape to become more cuboidally faceted. In such a situation the strain field will fall off more slowly from the interface, the preferred adatom site density on the islands for the silver will be lower (leading to more silver nucleation and growth centers on the NaCl rather than on the nickel), and the sharper corners of the faceted islands will promote dislocation nucleation at such points. We also showed that the nickel islands could move on the NaCl to which they are weakly bonded. For a noncontinuous Ag deposit, the nickel islands did not remain randomly distributed, as they would have been on the NaCl substrate prior to Ag deposition, but tended to be drawn to the edges of the silver agglomerations. This island mobility is probably very important in allowing silver islands growing from different nickel island sites to join together without the retention of a stacking fault if they meet without perfect lattice correspondence.

Figure 2:
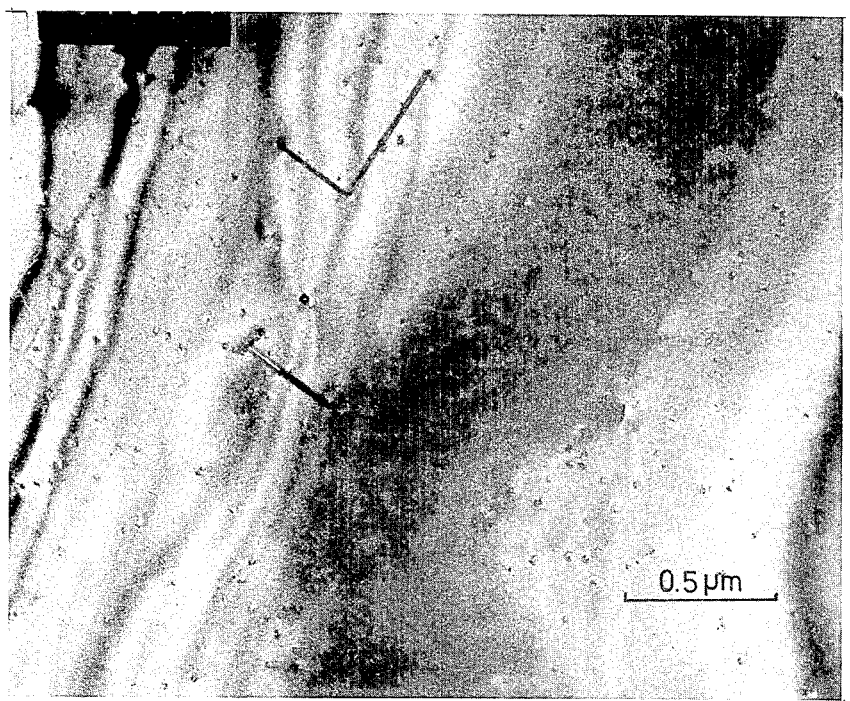
FIG. 2 shows a micrograph of a film of gold grown upon a silver film upon multiple aligned islands of nickel deposited upon vacuum cleaved NaCl.
Figure 3:
FIG. 3 shows a micrograph of a film of gold deposited upon a layer of silver which was deposited directly upon vacuum cleaved NaCl. Film preparation was otherwise identical and in the same enclosure as that for the film in FIG. 2.

Silver films grown from a NaCl substrate are often used to grow thin Au films. Gold and silver have very similar lattice parameters, so a gold layer will grow on a strain-free silver surface in much the same way as it would grow on itself. J. W. Matthews "Preparation of Gold Films with Low Disclocation Densities," J. Mat. Sci. 3 pp. 448–9, 1968 describes the deposition of gold on a silver pellet as contrasted with the deposition of Au on an air cleaved NaCl substrate. Accordingly, we grew Au films by evaporation with the substrate at room temperature and the vacuum chamber at a pressure of $10^{-9}$ Torr to a thickness of about 100 nm on silver films which had been deposited as described above onto NaCl substrates both with and without the prior intermediate Ni island 12 deposition. The Au films 14 in the schematic diagram of FIG. 1 grown on Ag film 13 on Ni islands 12 as described above and other Au films were examined as a function of their previously correlated position relative to the graded nickel island deposition after removal of the NaCl substrate 10 by water dissolution and the Ag film 13, etc. and Ni islands 12, etc. by dissolving them in dilute nitric acid. We found that the defect density in the gold foil remaining followed closely that in the previously examined and similarly prepared Ag films. Where no nickel islands 12 had underlain the silver film, the gold film grown from the silver film had a high fault density, and where the nickel film had been continuous, the gold film like the silver film from which it grew was polycrystalline. In the intervening regions of low nickel island concentration, the gold films were substantially more perfect. The defect density found in both the silver and gold films with no underlying nickel islands was about $1.5 \times 10^{10}/cm^2$, whereas for the films grown areas with partial nickel island coverage, the defect density was as low as $1.5 \times 10^8/cm^2$. Examples of micrographs of films of the Au grown in the two manners, with Ni islands and without them, are shown in FIG. 2 and FIG. 3.

It has been demonstrated that a one hundredfold improvement in film quality can be obtained by use of the technique described here in preparing thin monocrystalline silver or gold films.

The principles of the method are outlined above and their relevance discussed. It is expected that, provided these principles are followed for the material and general specification of an intervening seed island system, the "multiple aligned seed island" technique ought to be applicable to the growth of improved quality films of, for example, GaAs on Si, GaP on GaAs, or Si on $Al_2O_3$.

What is claimed is:

1. A structure composed of laminations of several materials including a substrate having a surface of a first single crystal material comprising monocrystalline NaCl,
    an intermediate layer of a plurality of Ni crystal islands deposited in epitaxial alignment on said surface of a first single crystal material said islands covering less than about 30% of said substrate, and
    an upper layer of monocrystalline epitaxial Ag crystals deposited in the form of a single crystal upon said surface and said intermediate layer with a substantial lattice misfit between said third material and said first single crystal material.

2. A structure in accordance with claim 1 wherein an epitaxial monocrystalline film of a fourth material comprising Au is deposited upon said upper layer in the form of a single crystal of Au.

3. A structure in accordance with claim 1 wherein said Ni crystal islands have a generally spherical surface extending away from said monocrystalline NaCl surface.

4. A structure in accordance with claim 1 wherein there are about $10^{11}$ of said Ni crystal islands per square centimeter on the surface of said monocrystalline NaCl with an average one of said islands having a diameter of about $10 \times 10^{-9}$ meters providing a coverage of between about 5% and 30% of the area of said NaCl surface.

5. A structure in accordance with claim 1 wherein said Ni crystal islands have a generally spherical surface extending away from said monocrystalline NaCl surface with about $10^{11}$ of said Ni crystal islands per square centimeter on the surface of said monocrystalline NaCl with an average one of said islands having a diameter of about $10 \times 10^{-9}$ meters and said islands providing a coverage of between about 5% and 30% of the area of said NaCl surface.

6. A method of producing a thin epitaxial monocrystalline film of a metal including
    providing a substrate having a deposition surface composed of a monocrystalline NaCl structure,
    forming epitaxial crystal islands of an intermediate material comprising Ni structures on said NaCl structure, said islands covering less than about 30% of said substrate, and
    vacuum depositing said epitaxial monocrystalline film of Ag crystals upon said deposition surface covered with said islands of an intermediate material.

7. A method in accordance with claim 6 wherein an epitaxial monocrystalline film of a fourth material comprising Au is vacuum deposited upon said epitaxial Ag crystals.

8. A method in accordance with claim 6 wherein said Ni crystal islands are deposited having a generally spherical surface extending away from said monocrystalline NaCl surface.

9. A method in accordance with claim 6 wherein said Ni crystal islands are deposited to a density of about $10^{11}$ Ni crystal islands per square centimeter on the surface of said monocrystalline NaCl with an average one of said islands having a diameter of about $10 \times 10^{-9}$ meters and providing a coverage of between about 5% and 30% of the area of said NaCl surface.

10. A method in accordance with claim 6 wherein said Ni crystal islands are deposited having a generally spherical surface extending away from said monocrystalline NaCl surface with about $10^{11}$ Ni crystal islands per square centimeter on the surface of said monocrystalline NaCl with an average one of said islands having an average diameter of about $10 \times 10^{-9}$ meters and said islands providing a coverage of between about 5% and 30% of the area of said NaCl surface.

* * * * *